(12) United States Patent
Lee et al.

(10) Patent No.: US 12,058,895 B2
(45) Date of Patent: Aug. 6, 2024

(54) DISPLAY DEVICE WITH REDUCED CROSSTALK AND MANUFACTURING METHOD OF THE SAME

(71) Applicant: Samsung Display Co., Ltd., Yongin-Si (KR)

(72) Inventors: Younjoo Lee, Hwaseong-si (KR); Jingyu Kang, Cheonan-si (KR); Yonghoon Kim, Asan-si (KR); Yonggu Lee, Cheonan-si (KR); Sung Jae Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 275 days.

(21) Appl. No.: 17/530,369

(22) Filed: Nov. 18, 2021

(65) Prior Publication Data

US 2022/0262878 A1 Aug. 18, 2022

(30) Foreign Application Priority Data

Feb. 18, 2021 (KR) .................. 10-2021-0021844

(51) Int. Cl.
*H01L 27/32* (2006.01)
*H01L 51/52* (2006.01)
(Continued)

(52) U.S. Cl.
CPC ........... *H10K 59/122* (2023.02); *H10K 50/80* (2023.02); *H10K 50/82* (2023.02);
(Continued)

(58) Field of Classification Search
CPC .............. H10K 59/122; H10K 59/8723; H10K 50/8428
See application file for complete search history.

(56) References Cited

U.S. PATENT DOCUMENTS

2016/0254476 A1* 9/2016 Park ................. H10K 50/813
257/40
2016/0268354 A1* 9/2016 Xiong .................. H10K 59/122
(Continued)

FOREIGN PATENT DOCUMENTS

CN 103794634 A * 5/2014 ........... H10K 50/841
CN 105590954 A * 5/2016 ........... H10K 50/824
(Continued)

OTHER PUBLICATIONS

Machine translation, Li, Chinese Pat. Pub. No. CN105590954A, translation date: Dec. 15, 2023, Espacenet, all pages. (Year: 2023).*
(Continued)

*Primary Examiner* — Victoria K. Hall
(74) *Attorney, Agent, or Firm* — Innovation Counsel LLP

(57) ABSTRACT

A display device includes a substrate, a plurality of first electrodes disposed on the substrate, a pixel defining layer disposed on the substrate, and defining a plurality of opening areas by exposing a portion of an upper surface of each of the plurality of first electrodes, a spacer disposed on the pixel defining layer and disposed between two adjacent opening areas among the plurality of opening areas, a groove extending into the spacer, a first common layer covering the plurality of first electrodes, the pixel defining layer, and the spacer, a plurality of light emitting layers disposed on the first common layer to overlap each of the plurality of opening areas, and a second electrode covering the plurality of light emitting layers and the first common layer. The groove at least partially overlaps with an imaginary straight line connecting two points located at the shortest distance between adjacent opening areas.

11 Claims, 10 Drawing Sheets

(51) Int. Cl.
*H01L 51/56* (2006.01)
*H10K 50/80* (2023.01)
*H10K 50/82* (2023.01)
*H10K 50/842* (2023.01)
*H10K 59/122* (2023.01)
*H10K 71/00* (2023.01)
*H10K 59/12* (2023.01)

(52) U.S. Cl.
CPC ......... *H10K 50/8428* (2023.02); *H10K 71/00* (2023.02); *H10K 59/1201* (2023.02)

(56) References Cited

U.S. PATENT DOCUMENTS

| | | | | |
|---|---|---|---|---|
| 2017/0155075 | A1* | 6/2017 | Bi | H10K 59/122 |
| 2018/0062109 | A1* | 3/2018 | Kim | H10K 59/122 |
| 2018/0175311 | A1* | 6/2018 | Jin | H10K 71/00 |
| 2018/0261797 | A1* | 9/2018 | Lee | H10K 30/865 |
| 2019/0027543 | A1* | 1/2019 | Zhang | H10K 59/88 |
| 2019/0212780 | A1* | 7/2019 | Choi | G09F 9/301 |
| 2020/0119114 | A1* | 4/2020 | Kim | H10K 50/8428 |
| 2020/0258959 | A1* | 8/2020 | Mao | H10K 71/00 |
| 2020/0286964 | A1* | 9/2020 | Cho | H10K 59/65 |
| 2021/0408438 | A1* | 12/2021 | Liu | H10K 50/8428 |
| 2022/0013603 | A1* | 1/2022 | Kim | H10K 59/131 |
| 2022/0123099 | A1* | 4/2022 | Jia | H10K 50/80 |
| 2022/0310721 | A1* | 9/2022 | Ma | H10K 50/8428 |
| 2023/0209910 | A1* | 6/2023 | Park | H10K 59/80521 257/40 |

FOREIGN PATENT DOCUMENTS

| | | | | | |
|---|---|---|---|---|---|
| CN | 108649057 | A | | 10/2018 | |
| CN | 109346505 | B | * | 4/2021 | H10K 59/122 |
| CN | 113113456 | A | * | 7/2021 | H10K 50/822 |
| CN | 113314579 | A | * | 8/2021 | H10K 59/12 |
| KR | 10-2010-0022738 | A | | 3/2010 | |
| KR | 10-2016-0104804 | A | | 9/2016 | |
| KR | 10-2016-0149599 | A | * | 12/2016 | H01L 27/3248 |
| KR | 10-2016-0149599 | A | | 12/2016 | |
| KR | 10-2020-0000859 | A | | 1/2020 | |
| KR | 10-2103499 | B1 | | 4/2020 | |
| KR | 10-2020-0076278 | A | * | 6/2020 | H10K 50/8428 |
| KR | 10-2020-0076278 | A | | 6/2020 | |
| KR | 10-2118920 | B1 | | 6/2020 | |
| KR | 10-2020-0089779 | A | | 7/2020 | |

OTHER PUBLICATIONS

Machine translation, Lu, Chinese Pat. Pub. No. CN-103794634-A, translation date: Dec. 15, 2023, Clarivate Analytics, all pages. (Year: 2023).*

Machine translation, Zhang, Chinese Pat. Pub. No. CN-109346505-B, translation date: Dec. 15, 2023, Clarivate Analytics, all pages. (Year: 2023).*

Machine translation, Du, Chinese Pat. Pub. No. CN-113113456-A, translation date: Dec. 15, 2023, Clarivate Analytics, all pages. (Year: 2023).*

Machine translation, Song, Chinese Pat. Pub. No. CN-113314579-A, translation date: Dec. 15, 2023, Espacenet, all pages. (Year: 2023).*

Machine translation, Jeong, Korean Pat. Pub. No. KR2016-0149599A, translation date: Oct. 17, 2023, Espacenet, all pages. (Year: 2023).*

Machine translation, Nam, Korean Pat. Pub. No. KR2020-0076278A, translation date: Oct. 17, 2023, Espacenet, all pages. (Year: 2023).*

Lieven Penninck et al. "Modelling crosstalk through common semiconductor layers in AMOLED displays: Modelling crosstalk in AMOLED displays" Society for Information Display, Jun. 9, 2021, 10pages.

* cited by examiner

DISPLAY DEVICE WITH REDUCED CROSSTALK AND MANUFACTURING METHOD OF THE SAME

CROSS-REFERENCE TO RELATED APPLICATION

This application claims priority under 35 U.S.C. § 119 to Korean Patent Application No. 10-2021-0021844 filed on Feb. 18, 2021 in the Korean Intellectual Property Office (KIPO), the disclosure of which is incorporated by reference herein in its entirety.

1. TECHNICAL FIELD

The present invention relates to a display device and a manufacturing method of a display device.

2. DESCRIPTION OF THE RELATED ART

An organic light emitting display device is a device in which a hole injected from an anode and an electron injected from a cathode meet in an emission layer to emit light. In order to define a light emitting area of the organic light emitting display device, the organic light emitting display device may include a pixel defining layer. A spacer may be disposed on the pixel defining layer.

Recently, as a degree of integration of the organic light emitting display device increases, a crosstalk in which holes move from a light emitting area to another adjacent light emitting area occurs. Accordingly, a display performance of the organic light emitting display device may deteriorate.

SUMMARY

Embodiments of the present invention provide a display device having improved display performance.

Embodiments of the present invention provide a manufacturing method of a display device having improved display performance.

A display device according to an embodiment includes a substrate, a plurality of first electrodes disposed on the substrate, a pixel defining layer disposed on the substrate and defining a plurality of opening areas by exposing a portion of an upper surface of each of the plurality of first electrodes, a spacer disposed on the pixel defining layer and disposed between two adjacent opening areas among the plurality of opening areas, a groove extending into the spacer and at last partially overlapping with an imaginary straight line connecting two points located at the shortest distance between the two adjacent opening areas in a plan view, a first common layer covering the plurality of first electrodes, the pixel defining layer, and the spacer, a plurality of light emitting layers disposed on the first common layer above the plurality of opening areas, and a second electrode covering the plurality of light emitting layers and the first common layer.

In an embodiment, the spacer may surround the groove.

In an embodiment, the groove may have a rectangular shape in plan view.

In an embodiment, the groove may have a cross shape in plan view.

In an embodiment, the first common layer covers a sidewall of the groove.

In an embodiment, the first common layer may cover an exposed portion of an upper surface of the pixel defining layer at a base of the groove.

In an embodiment, the groove may extend into at least a portion of the pixel defining layer.

In an embodiment, the display device may further include a second common layer disposed between the plurality of light emitting layers and the second electrode and covering the plurality of light emitting layers and the first common layer.

In an embodiment, the second common layer may extend into the groove.

In an embodiment, each of the plurality of light emitting layers may extend over the spacer.

In an embodiment, each of the plurality of first electrodes in an anode electrode may be an anode electrode, the first common layer may be a hole injection layer, and the second electrode may be a cathode electrode.

A manufacturing method of a display device according to an embodiment includes forming a plurality of first electrodes on a substrate, forming an organic layer on the substrate, the organic layer covering the plurality of first electrodes, etching the organic layer to form a pixel defining layer defining a plurality of opening areas by exposing a portion of an upper surface of each of the plurality of first electrodes, a spacer disposed between two adjacent opening areas among the plurality of opening areas, and a groove extending into the spacer, the groove at least partially overlapping with an imaginary straight line connecting two points located at the shortest distance between the two adjacent opening areas in a plan view, forming a first common layer covering the plurality of first electrodes, the pixel defining layer, and the spacer, forming a plurality of light emitting layers on the first common layer above the plurality of opening areas, and forming a second electrode covering the plurality of light emitting layers and the first common layer.

In an embodiment, the pixel defining layer, the spacer, and the groove may be integrally formed.

In an embodiment, the method may further include disposing a first mask including a first transflective part, a second transflective part, a transparent part, and a light blocking part on the organic layer.

In an embodiment, the first transflective part may correspond to the pixel defining layer, the second transflective part may correspond to the groove, the transparent part may correspond to the plurality of opening areas, and the light blocking part may correspond to the spacer.

In an embodiment, a transmittance of the first transflective portion of the first mask may be same as a transmittance of the second transflective portion of the first mask.

In an embodiment, a transmittance of the second transflective portion of the first mask may be greater than a transmittance of the first transflective portion of the first mask.

In an embodiment, the method may further include disposing a fine metal mask (FMM) on the first common layer overlapping each of the plurality of opening areas.

In an embodiment, the fine metal mask may directly contact the first common layer on the spacer.

In an embodiment, the plurality of light emitting layers may be formed to extend over the spacer from the first common layer overlapping each of the plurality of opening areas.

The display device according to an embodiment may include a spacer in which a groove is formed. Accordingly, the display device having improved display performance may be provided.

The manufacturing method of the display device according to an embodiment may provide a manufacturing method of a display device including a spacer having a groove formed therein. Accordingly, the manufacturing method of the display device having improved display performance may be provided

DETAILED DESCRIPTION OF THE EMBODIMENTS

Figure 1:
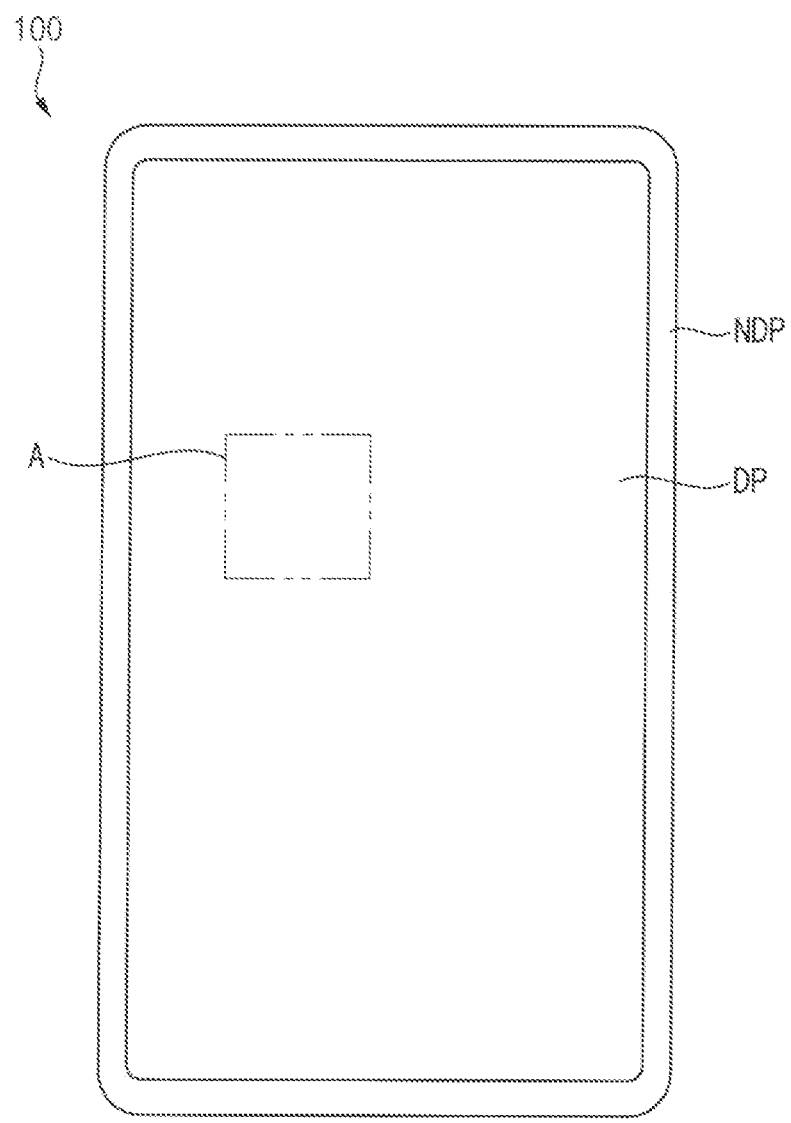
FIG. 1 is a plan view illustrating a display device according to an embodiment.

Hereinafter, a display device and a manufacturing method of a display device according to embodiments of the present invention will be described in more detail with reference to the accompanying drawings. The same or similar reference numerals may be used for the same elements in the accompanying drawings.

FIG. 1 is a plan view illustrating a display device according to an embodiment.

Referring to FIG. 1, a display device 100 may include a display area DP and a non-display area NDP.

The display area DP may be an area in which an image is displayed on the display device 100. The display device 100 may include a plurality of pixels emitting light in the display area DP. The plurality of pixels may receive an electrical signal, and may emit light having a luminance corresponding to an intensity of the electrical signal.

The non-display area NDP may be an area in which an image is not displayed on the display device 100. The display device 100 may include a driving circuit in the non-display area NDP. The driving circuit may include a data driving circuit, a gate driving circuit, and a timing controller. The driving circuit may generate the electrical signal, and may provide the electrical signal to the plurality of pixels.

Figure 2:
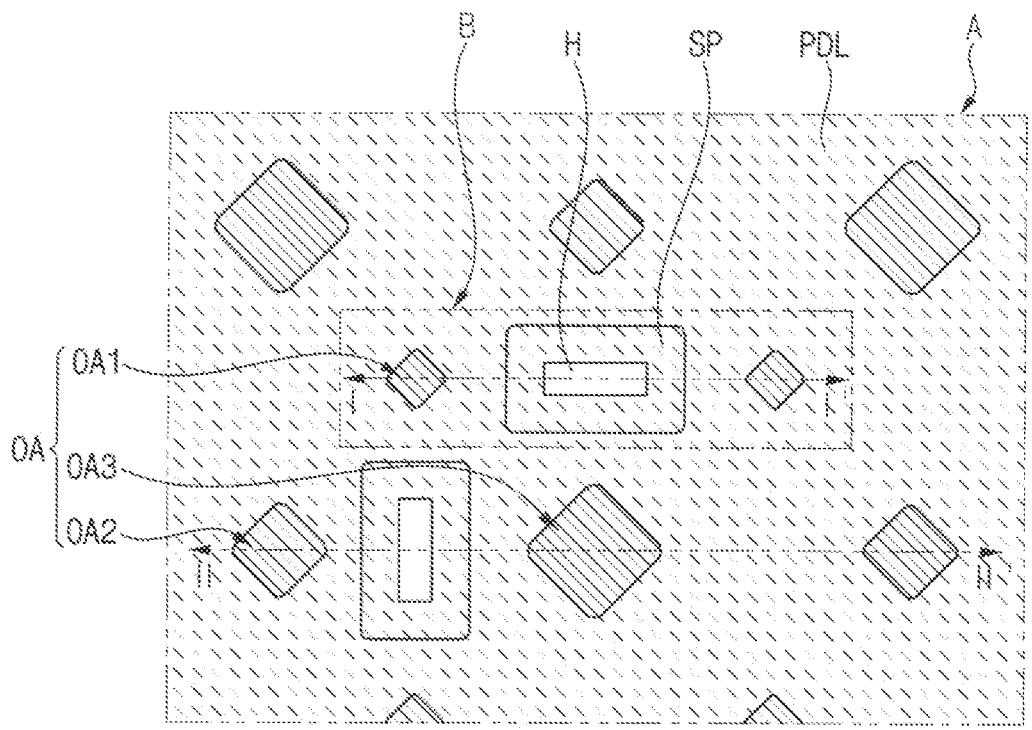
FIG. 2 is a plan view enlarging an area A of FIG. 1.
Figure 3:
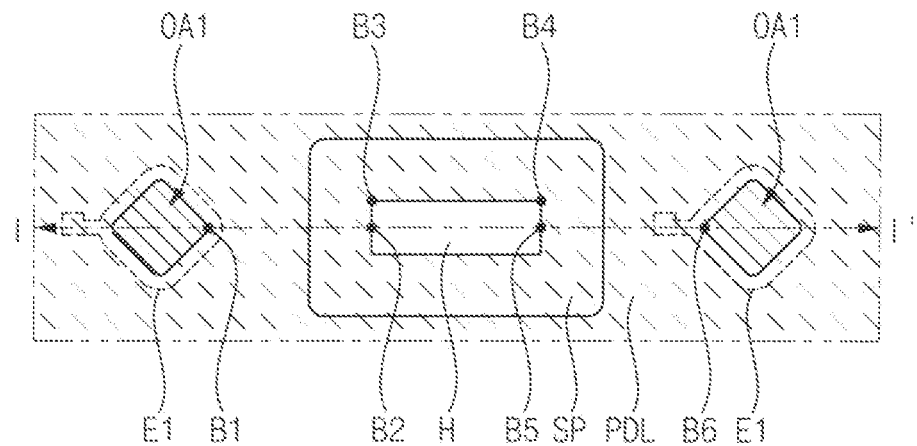
FIG. 3 is a plan view enlarging an area B of FIG. 2.
Figure 4:
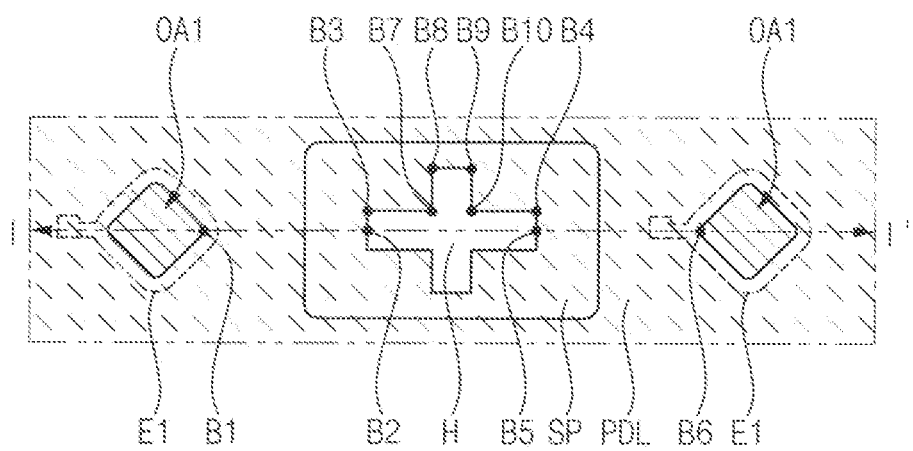
FIG. 4 is a plan view enlarging an area B of FIG. 2.
Figure 5:
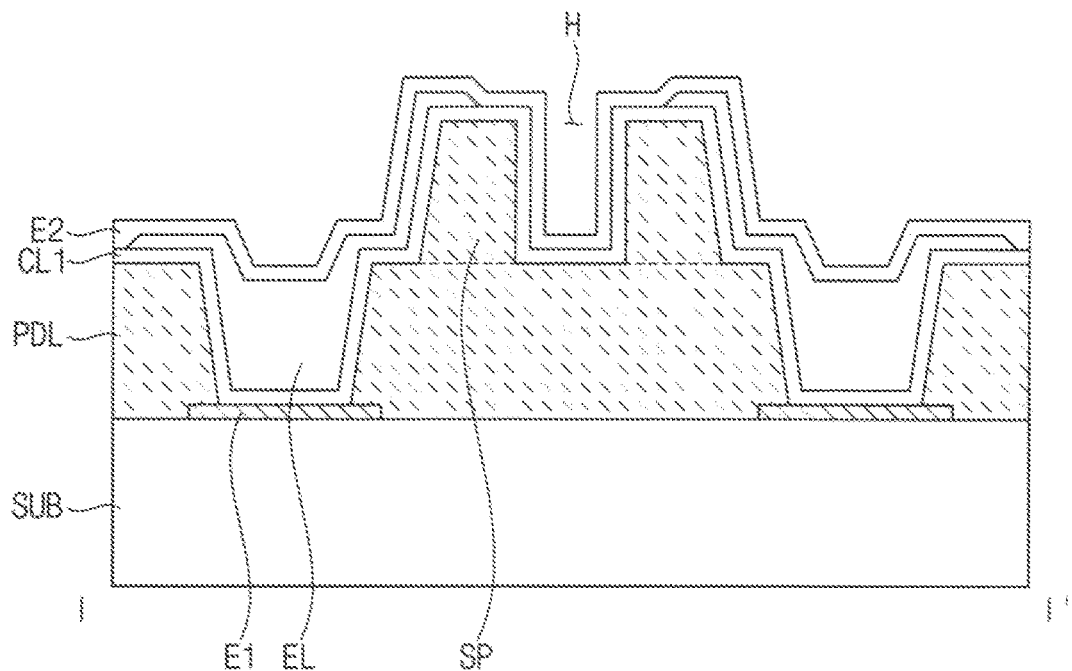
FIG. 5, FIG. 6, FIG. 7, and FIG. 8 are cross-sectional views taken along a line IT of FIG. 2.

FIG. 2 is a plan view enlarging an area A of FIG. 1. FIG. 3 and FIG. 4 are plan views enlarging an area B of FIG. 2. FIG. 5 is a cross-sectional view taken along a line I-I' of FIG. 2.

Referring to FIG. 2, FIG. 3, FIG. 4, and FIG. 5, a display device 100 may include a substrate SUB, a plurality of first electrodes E1, a pixel defining layer PDL, a spacer SP, a first common layer CL1, a plurality of light emitting layer EL, and a second electrode E2.

The substrate SUB may include a plurality of transistors. Each of the plurality of transistors may be electrically connected to each of the plurality of first electrodes E1. The plurality of transistors may provide an electrical signal to the plurality of first electrodes E1.

Figure 6:
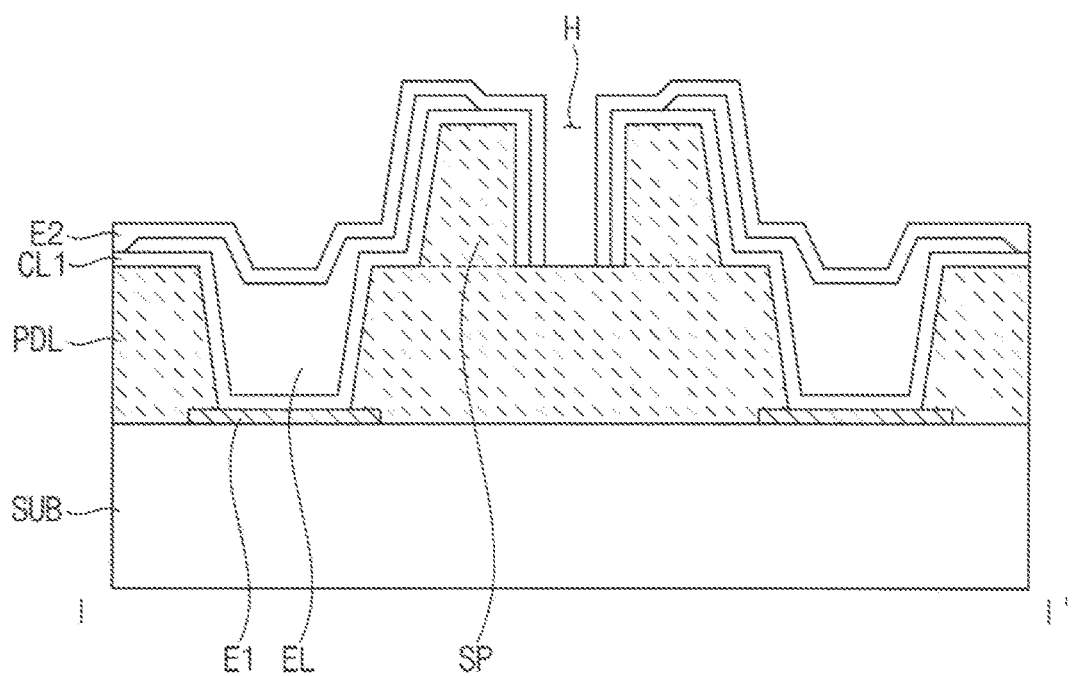

The plurality of first electrodes E1 may be disposed on the substrate SUB. Each of the plurality of first electrodes E1 may include a conductive material. For example, each of the plurality of first electrodes E1 may include a metal. Each of the plurality of first electrodes E1 may be disposed to be spaced apart from each other on the substrate SUB. The first electrodes E1 may contact the substrate SUB as shown in FIG. 5 and FIG. 6, although this is not a requirement. Each of the plurality of first electrodes E1 may be an anode electrode. That is, each of the plurality of first electrodes E1 may provide holes to the plurality of light emitting layer EL.

The pixel defining layer PDL may be disposed on the substrate SUB. The pixel defining layer PDL may define a plurality of opening areas OA by exposing a portion of an upper surface of each of the plurality of first electrodes E1. In the plurality of opening areas OA, the plurality of first electrodes E1 may directly contact the first common layer CL1.

The spacer SP may be disposed on the pixel defining layer PDL. Also, the spacer SP may be disposed between two adjacent opening areas among the plurality of opening areas OA. The spacer SP may define a groove H extending into and formed in the spacer SP. The spacer may surround the groove H. For example, the groove H may have a closed curve shape in a plan view.

The first common layer CL1 may cover the plurality of first electrodes E1, the pixel defining layer PDL, and the spacer SP. The first common layer CL1 may serve as a passage through which the holes provided from the plurality of first electrodes E1 move. Accordingly, the first common layer CL1 may transfer the holes to the plurality of light emitting layer EL. The first common layer CL1 may be a hole injection layer (HIL). The hole injection layer may include a metal oxide having a relatively high work function. For example, the metal oxide may be WOx (Tungsten Oxide), VOx (Vanadium Oxide), MoOx (Molybdenum Oxide), RhOx (Rhodium Oxide), IrOx (Iridium Oxide), NiOx (Nickel Oxide), CoOx (Cobalt Oxide) or combinations thereof.

The plurality of light emitting layers EL may be disposed on the first common layer CL1 in each of the plurality of opening areas OA. Each of the plurality of light emitting layers EL may emit light. Specifically, the first common layer CL1 may receive the holes from the plurality of first electrodes E1, and may transfer the holes to the plurality of light emitting layers EL. Also, the plurality of light emitting layers EL may receive electrons from the second electrode E2. The holes and the electrons may be combined in the plurality of light emitting layer EL to emit light.

The holes may move through the first common layer CL1 between two adjacent first electrodes among the plurality of first electrodes E1. This may be referred to as a crosstalk. When the crosstalk occurs, the holes may not be transferred to the plurality of light emitting layers EL, but may move only between two adjacent first electrodes among the plurality of first electrodes E1. Accordingly, since the number of holes transferred to the plurality of light emitting layers EL is relatively decreased, a luminous efficiency of the plurality of light emitting layers EL may decrease. Accordingly, crosstalk undesirably lowers the performance of the display device 100.

The second electrode E2 may cover the plurality of light emitting layers EL and the first common layer CL1. The second electrode E2 may include a conductive material. For example, the second electrode E2 may include a metal. The second electrode E2 may be a cathode electrode. That is, the second electrode E2 may provide the electrons to the plurality of light emitting layers EL.

Referring back to FIG. 2, FIG. 2 may be a plan view illustrating the pixel defining layer PDL, the spacer SP disposed on the pixel defining layer PDL, and the plurality of opening areas OA.

The plurality of opening areas OA may include a first opening area OA1, a second opening area OA2, and a third opening area OA3. Lights having different colors may be emitted from each of the first to third opening areas OA1, OA2, and OA3. For example, the display device 100 may emit green light from the first opening area OA1, and may emit red light from the second opening area OA2. In the third opening area OA3, the display device 100 may emit blue light. As illustrated in FIG. 2, the first to third opening areas OA1, OA2, and OA3 may be regularly arranged.

Referring back to FIG. 3, FIG. 3 may be a plan view enlarging two adjacent first opening areas OA1 in FIG. 2.

The spacer SP may be disposed between two first opening areas OA1 adjacent to each other, and at least a portion of the groove H defined by the spacer SP may be arranged to overlap with an imaginary straight line I-I' connecting two points B1 and B6 located at the shortest distance between the two adjacent first opening areas OA1. For example, the shortest distance between the two adjacent first opening areas OA1 may be represented by a line segment connecting the points B1 and B6. In this case, the groove H may overlap a line segment connecting two points B2 and B5. Accordingly, the holes would have to travel a greater distance to move between the two adjacent first electrodes E1.

For example, when a groove H is not present, the holes may move along a line segment connecting the points B1 and B6. In this case, the crosstalk may occur.

When a groove is present, the holes may bypass the groove H and may move between the two first electrodes E1 adjacent to each other. For example, when the groove H having a rectangular shape on a plane is present, the holes may move a longer distance, along a line connecting points B1, B2, B3, B4, B5, and B6 in sequence as shown in FIG. 3.

A travel distance of the holes when the groove H is present may be greater than the travel distance of the holes when the groove H is not present by a value obtained by adding a length of a line segment connecting points B2 and B3 and a length of a line segment connecting points B4 and B5. This additional distance that holes have to travel may act as a "barrier" to crosstalk. Accordingly, when the groove H is present, the crosstalk may not occur between the two adjacent first electrodes E1.

Referring back to FIG. 4, FIG. 4 may be a plan view depicting two adjacent first opening areas OA1 in FIG. 2. FIG. 4 may be substantially same as FIG. 3 except for a shape of the groove H in a plan view.

The groove H may have a cross shape in a plan view. In this case, instead of going straight from point B3 to point B4 as in the case of FIG. 3, the holes move through points B7, B8, B9, and B10 between point B3 and point B4. In other words, the holes would move along a line segment sequentially connecting points B1, B2, B3, B7, B8, B9, B10, B4, B5, and B6, in that order.

The holes have to travel a greater distance when the groove H is present than when the groove H is not present. The difference in the travel distance, relative to if there were no groove H, would be obtained by adding a length of a line segment connecting points B2 and B3, a length of a line segment connecting points B7 and B8, a length of a line segment connecting points B9 and B10, and a length of a line segment connecting points B4 and B5.

FIG. 3 and FIG. 4 illustrate embodiments in which the groove H has a rectangular shape and a cross shape in a plan view, respectively, but the shape of the groove H is not limited thereto. The groove H may include any shape that increases a travel distance of the holes between the two adjacent first electrodes E1. For example, the groove H may have a circular shape in a plan view.

By adjusting the shape of the groove H, the travel distance of the holes may be increased. For example, as shown in FIG. 3, when the groove H has a rectangular shape in a plan view, the length of the line segment connecting the points B2 and B3 may be lengthened to increase the travel distance of the holes. In other words, a length of any one side of the rectangular shape may be adjusted to increase the travel distance of the holes.

For another example, as shown in FIG. 4, when the groove H has a cross shape in a plan view, the length of the line segment connecting the points B2 and B3 may be lengthened to increase the travel distance of the holes. Or, the travel distance of the holes may be increased by adjusting the length of the line segment connecting the points B4 and B5 to be longer.

Referring back to FIG. 3 and FIG. 5, the first common layer CL1 may extend into the groove H. Also, the first common layer CL1 may cover the exposed portion of the pixel defining layer PDL that form the base of the groove H. In other words, the first common layer CL1 may cover the walls and the base inside of the groove H.

Specifically, when a size of the groove H is relatively large (for example, when the length of the line segment connecting the points B2 and B3 in FIG. 3 and the length of the line segment connecting the points B3 and B4 are relatively long), in the process of forming the first common layer CL1, the first common layer CL1 may be formed to cover the inside of the groove H.

FIG. 6 is a cross-sectional view taken along a line IT of FIG. 2. Any redundant description will be omitted.

Referring to FIG. 3 and FIG. 6, the first common layer CL1 may extend into the groove H. Also, a portion of the upper surface of the pixel defining layer PDL exposed by the groove H may be exposed.

Specifically, when a size of the groove H is relatively small (for example, when the length of the line segment connecting the points B2 and B3 in FIG. 3 and the length of the line segment connecting the points B3 and B4 are relatively small), in the process of forming the first common layer CL1, the first common layer CL1 may not cover the exposed upper surface of the pixel defining layer PDL that form the base of the groove H. Accordingly, the two first electrodes E1 adjacent to each other may not be connected to each other by the first common layer CL1 in a cross-sectional view, as shown in FIG. 6.

Figure 7:
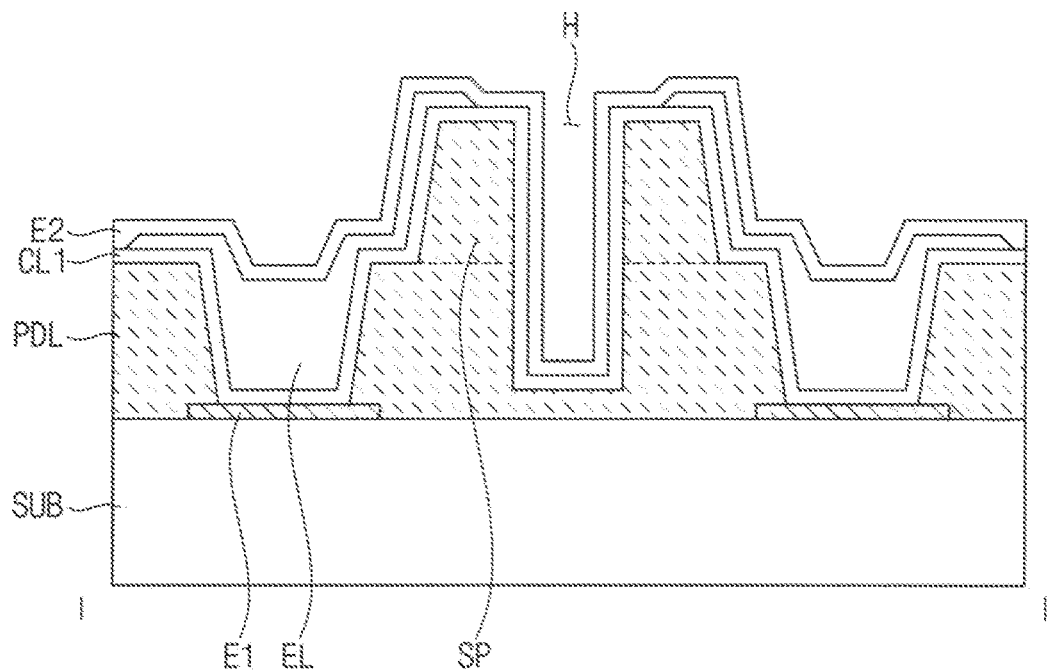

FIG. 7 is a cross-sectional view taken along a line I-I' of FIG. 2.

Referring to FIG. 3 and FIG. 7, the groove H may extend into at least a portion of the pixel defining layer PDL. Also, the first common layer CL1 may extend into the groove H and may cover the exposed upper surface of the pixel defining layer PDL at the base of the groove H.

When the groove H cuts into at least a portion of the pixel defining layer PDL, a depth of the groove H may be relatively deep. Accordingly, a length of the first common layer CL1 connecting the two adjacent first electrodes E1 in a cross-sectional view will be relatively long.

Figure 8:
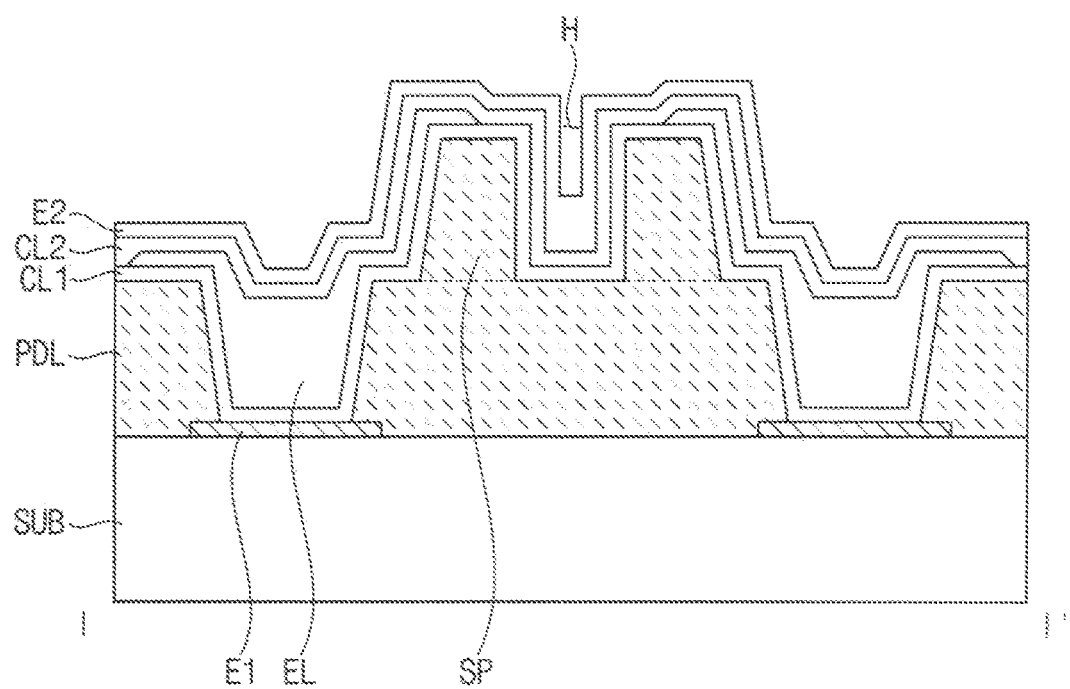

FIG. 8 is a cross-sectional view taken along a line I-I' of FIG. 2.

Referring to FIG. 3 and FIG. 8, a second common layer CL2 may be disposed between the plurality of light emitting layers EL and the second electrode E2. The second common layer CL2 may cover the plurality of light emitting layers EL and the first common layer CL1. Also, the second common layer CL2 may extend into the groove H to cover the wall and/or the base of the groove H. In the particular embodiment of FIG. 8, the second common layer CL2 is adjacent to, and maintains contact with, the second electrode E2.

The second common layer CL2 may be an electron transfer layer (ETL). The electron transfer layer may receive the electrons from the second electrode E2 and transfer the electrons to the plurality of light emitting layers EL.

Figure 9:
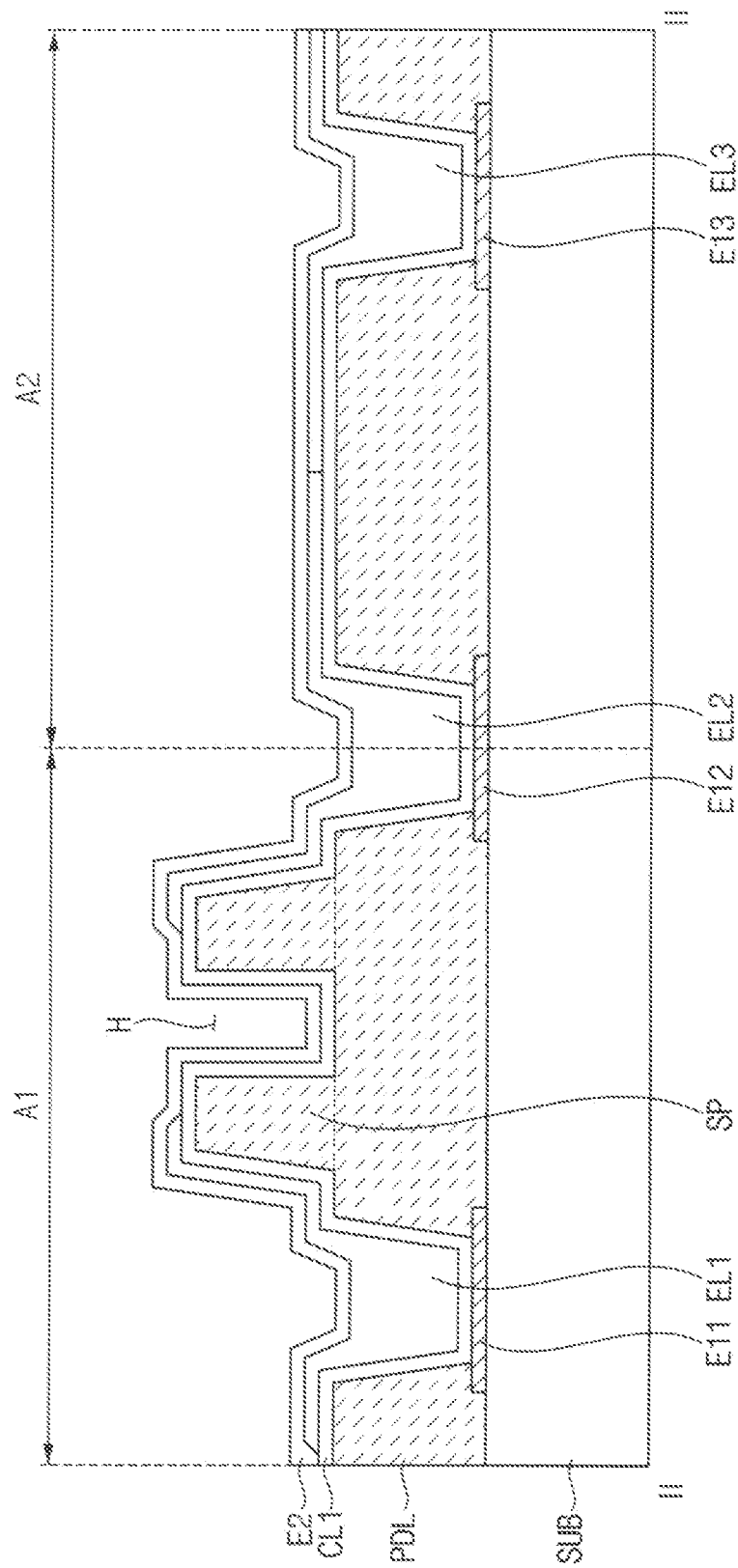
FIG. 9 is a cross-sectional view taken along a line II-IF of FIG. 2.

FIG. 9 is a cross-sectional view taken along a line II-IF of FIG. 2.

Referring to FIG. 9, a first area A1 may be an area in which the spacer SP is disposed between two adjacent first electrodes E11 and E12, and a second area A2 may be an area in which there is no spacer SP disposed between two adjacent first electrodes E12 and E13.

In the first area A1, two light emitting layers EL1 and EL2 disposed on the two adjacent first electrodes E11 and E12 may extend over the spacer SP. In this case, in the first area A1, the two light emitting layers EL1 and EL2 may not contact each other.

In the first area A1, since the display device 100 includes the groove H, the crosstalk may not occur between the two adjacent first electrodes E11 and E12.

In the second area A2, two light emitting layers EL2 and EL3 disposed on the two adjacent first electrodes E12 and E13 may extend over the pixel defining layer PDL. In other words, in the second area A2, the two light emitting layers EL2 and EL3 may disposed between the first common layer CL1 and the second electrode E2.

In one embodiment, in the second area A2, the two light emitting layers EL2 and EL3 may contact each other and cover the pixel defining layer PDL. In this case, in the second area A2, the holes existing in the first common layer CL1 on the pixel defining layer PDL and the electrons provided from the second electrode E2 on the pixel defining layer PDL may meet in the two light emitting layers EL2 and EL3 on the pixel defining layer PDL to emit light. That is, in the second area A2, the crosstalk in which the holes travel between the two adjacent first electrodes E12 and E13 through the first common layer CL1 may not occur.

FIG. 10, FIG. 11, FIG. 12, FIG. 13, FIG. 14, FIG. 15, FIG. 16, and FIG. 17 are cross-sectional views illustrating a manufacturing method of a display device according to an embodiment. For example, FIGS. 10 to 17 may be cross-sectional views illustrating a manufacturing method of the display device of FIG. 5.

Figure 10:
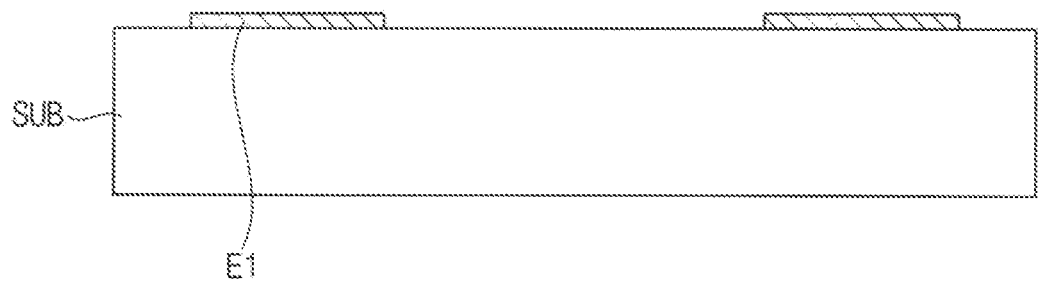
FIG. 10, FIG. 11, FIG. 12, FIG. 13, FIG. 14, FIG. 15, FIG. 16, and FIG. 17 are cross-sectional views illustrating a manufacturing method of a display device according to an embodiment.

Referring to FIG. 10, a plurality of first electrodes E1 may be formed on a substrate SUB. The substrate may be formed to include a plurality of transistors (not shown). Each of the plurality of first electrodes E1 may be formed to be electrically connected to the plurality of transistors.

Figure 11:
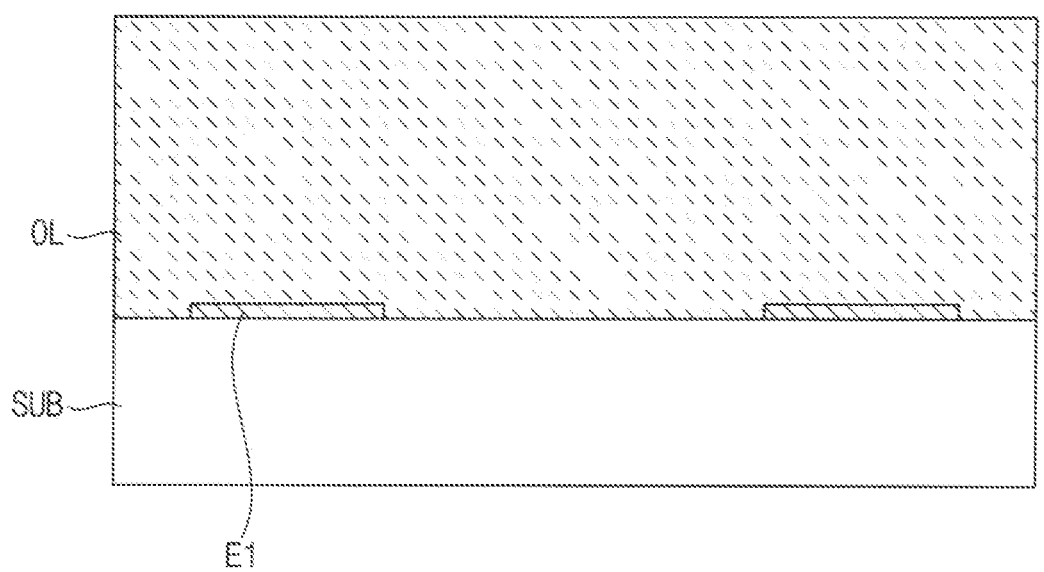

Referring to FIG. 11, an organic layer OL may be formed on the substrate SUB to cover the plurality of first electrodes E1. In this case, an upper surface of the organic layer OL may be substantially flat.

Figure 12:
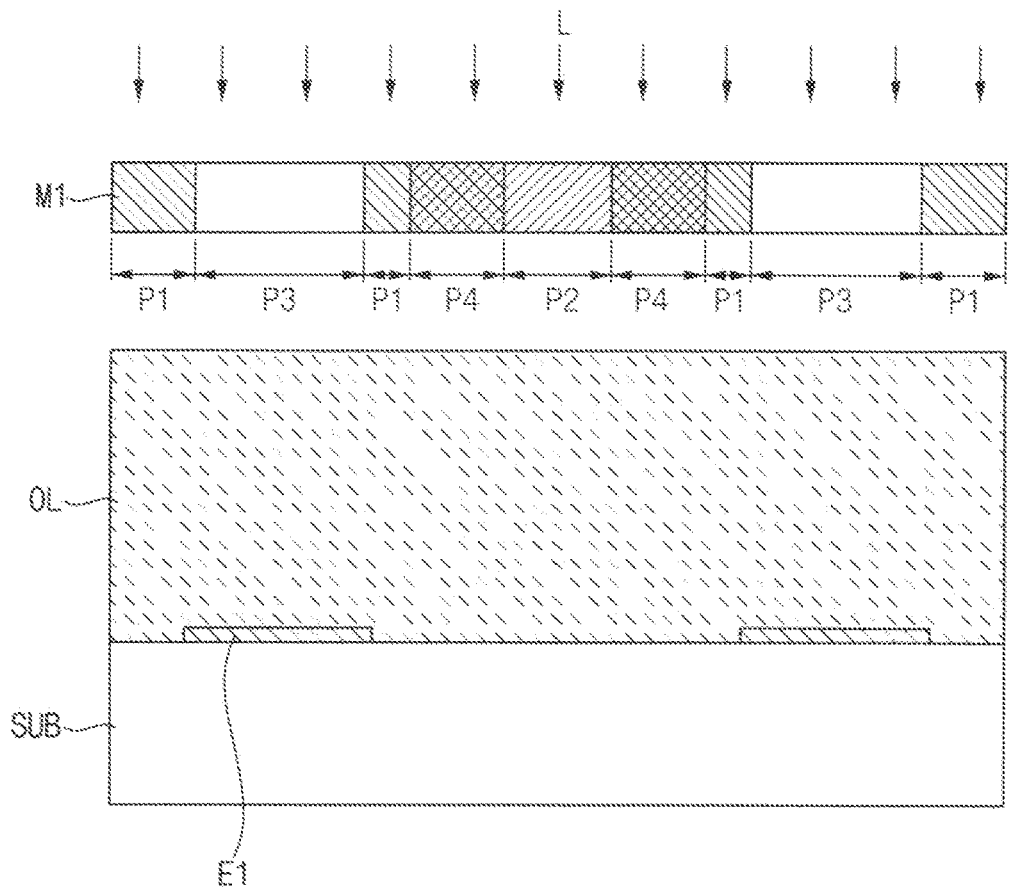

Referring to FIG. 12, the organic layer OL may be etched. In one embodiment, the organic layer OL may be etched by irradiating with laser L using a first mask M1.

The first mask M1 may include a first transflective part P1, a second transflective part P2, a transparent part P3, and a light blocking part P4.

The first transflective part P1 and the second transflective part P2 may transmit only a portion of the laser L. Accordingly, only the portion of the laser L passing through the first transflective part P1 and the second transflective part P2 may etch the organic layer OL. The first transflective part P1 may correspond to a pixel defining layer PDL, and the second transflective part P2 may correspond to a groove H.

The transparent part P3 may transmit all of the laser L. The light blocking part P4 may block the laser L. The transparent part P3 may correspond to a plurality of opening areas OA1, and the light blocking part P4 may correspond to a spacer SP.

Figure 13:
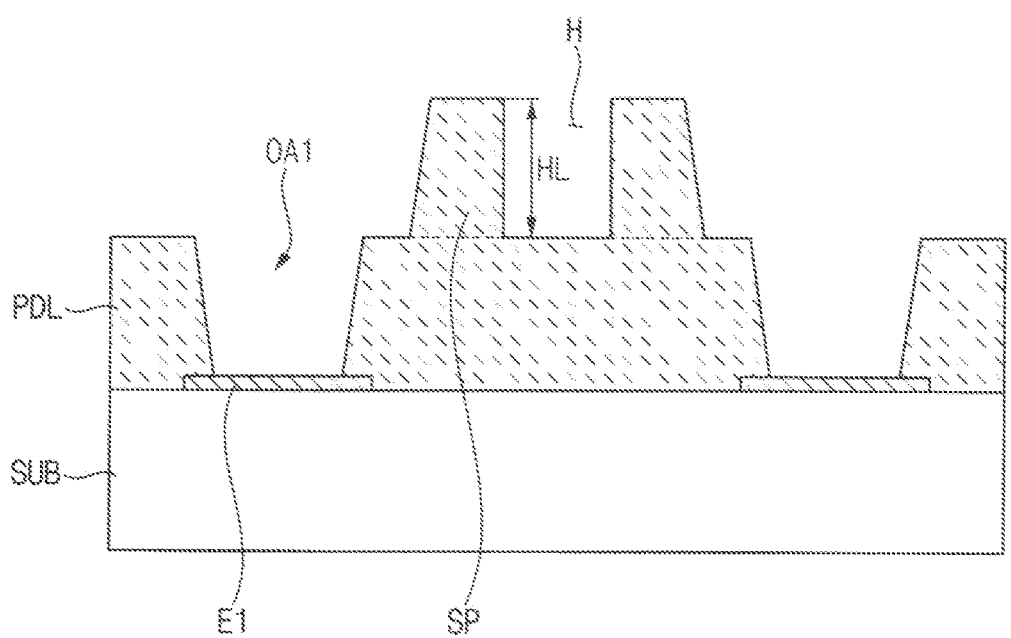

Referring to FIG. 13, the organic layer OL may be etched to from the pixel defining layer PDL, a spacer SP, and a groove H.

The pixel defining layer PDL may be formed to expose a portion of an upper surface of each of the plurality of first electrodes E1 to define the plurality of opening areas OA1. The plurality of opening areas OA1 may be formed in a portion of the organic layer OL that overlaps the transparent part P3.

The spacer SP may be disposed between two adjacent opening areas among the plurality of opening areas OA1. The spacer SP may be formed in a portion of the organic layer OL that overlaps the light blocking part P4.

The groove H may be formed to at least partially overlap with an imaginary straight line connecting two points located at the shortest distance between the two adjacent opening areas. The groove H may be formed in the spacer SP. The groove H may be formed in a portion of the organic layer OL that overlaps the second transflective part P2.

Referring back to FIG. 12 and FIG. 13, the pixel defining layer PDL, the spacer SP, and the groove H may be integrally formed. For example, the pixel defining layer PDL, the spacer SP, and the groove H may be formed by etching one organic layer (for example, organic layer OL) using only one mask (for example, first mask M1).

In one embodiment, a transmittance of the first transflective part P1 may be about half of a transmittance of the transparent part P3. Accordingly, a height of the spacer SP and a height of the pixel defining layer PDL may be substantially the same.

In one embodiment, a depth HL of the groove H may be adjusted by adjusting a transmittance of the second transflective part P2. For example, when the transmittance of the second transflective part P2 is substantially the same as the transmittance of the first transflective part P1, the groove H that extends through the spacer SP to an upper surface of the pixel defining layer PDL may be formed. On the other hand, when the transmittance of the second transflective part P2 is greater than the transmittance of the first transflective part P1, the groove H may extend into the spacer SP and into at least a portion of the pixel defining layer PDL.

Figure 14:
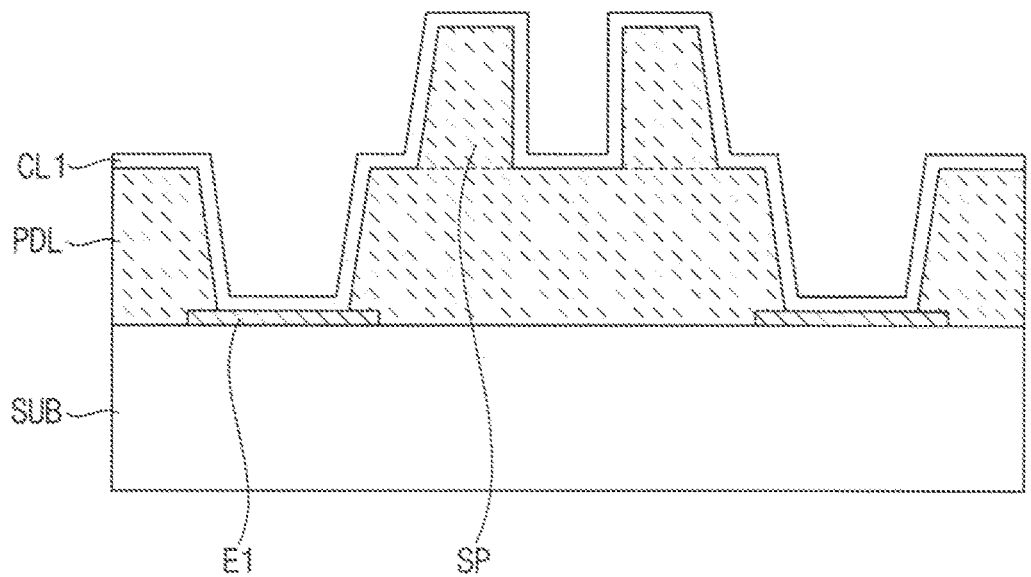

Referring to FIG. 14, a first common layer CL1 may be formed. The first common layer CL1 may be formed to cover the plurality of first electrodes E1, the pixel defining layer PDL, and the spacer SP.

In one embodiment, the first common layer CL1 may extend into the groove H and may be formed to cover the upper surface of the pixel defining layer PDL exposed by the groove H.

Figure 15:
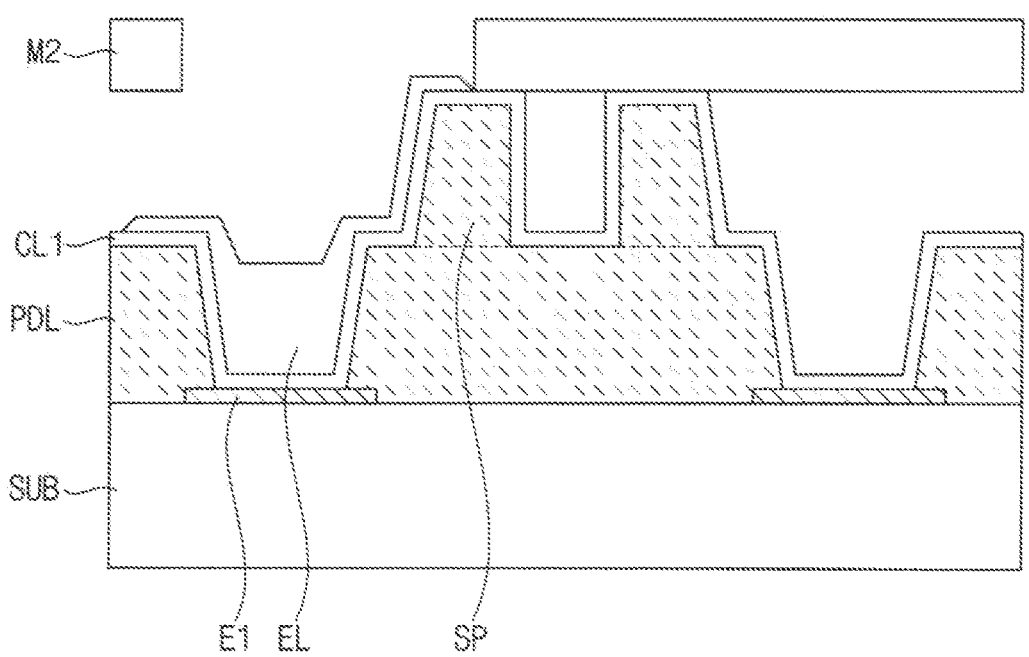
Figure 16:
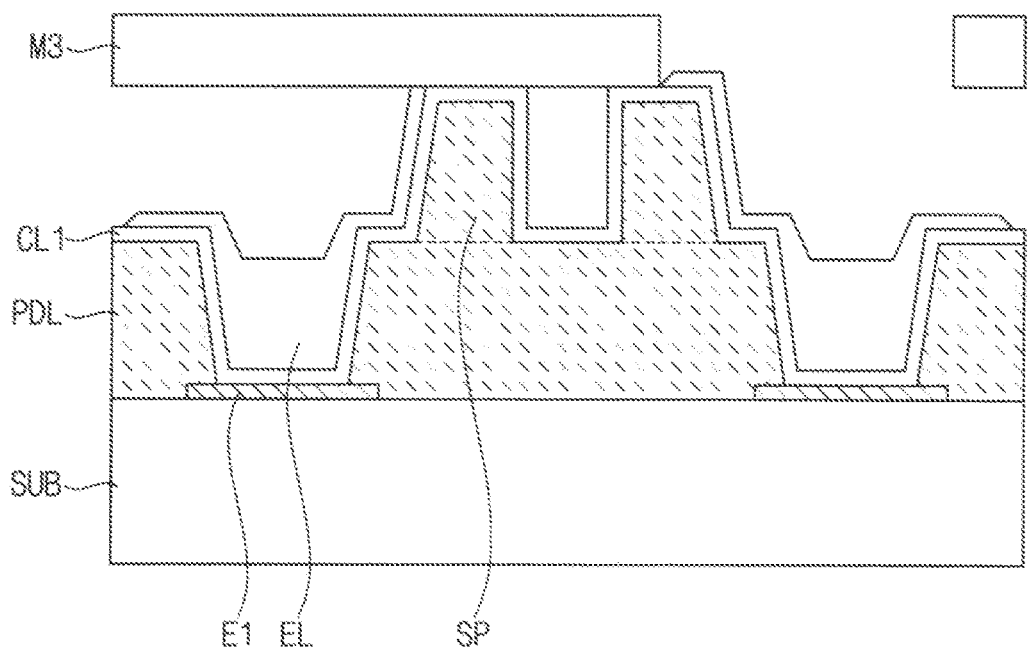

Referring to FIG. 15 and FIG. 16, a plurality of light emitting layers EL may be formed. Each of the plurality of light emitting layers EL may be formed to be disposed on the first common layer CL1 to overlap the plurality of opening areas OA1.

Each of the plurality of light emitting layers EL may be formed using different masks. For example, each of the plurality of light emitting layers EL may be formed using a second mask M2 and a third mask M3 in sequence. In this case, the second mask M2 and the third mask M3 may be a fine metal mask (FMM).

Forming the plurality of light emitting layers EL using the second mask M2 and the third mask M3 may include disposing second and third masks M2 and M3 on the first common layer CL1 to overlap the plurality of opening areas OA1. In this case, the second mask M2 and the third mask M3 may directly contact the first common layer CL1 on the spacer SP. Since the spacer SP is formed on the pixel defining layer PDL, the second mask M2 and the third mask M3 may not directly contact the first common layer CL1 on the pixel defining layer PDL.

Each of a size of an opening of the second mask M2 and a size of an opening of the third mask M3 may be larger than a size of each of the plurality of opening areas OA1. Accordingly, the plurality of light emitting layers EL may be formed to extend over the spacer SP from the first common layer CL1 of each of the plurality of opening areas OA1.

Figure 17:
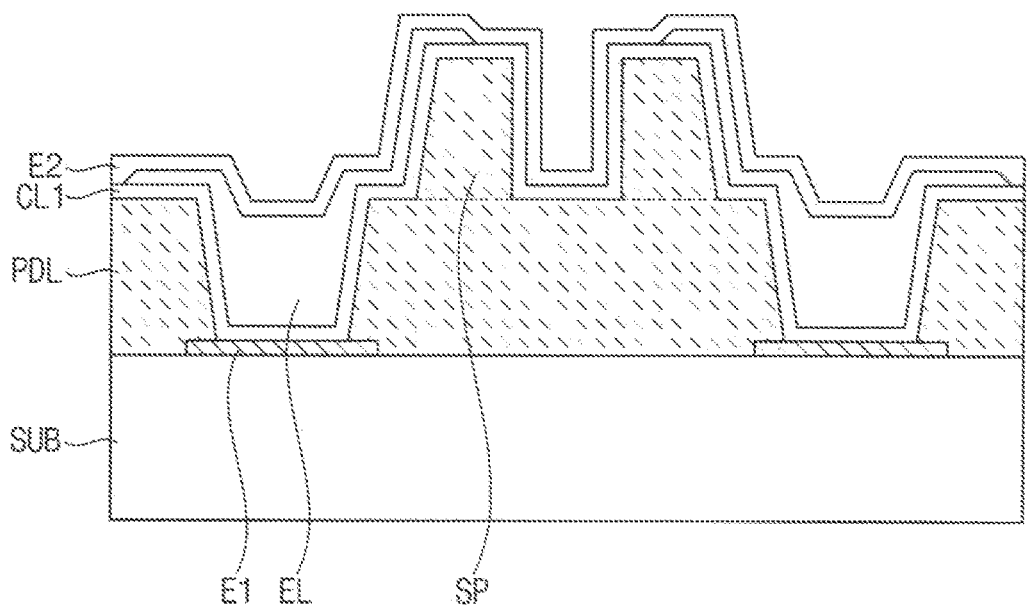

Referring to FIG. 17, a second electrode E2 may be formed. The second electrode E2 may be formed to cover the plurality of emission layers EL and the first common layer CL1.

It should be understood that embodiments described herein should be considered in a descriptive sense only not for purpose of limitation. Descriptions of features or aspects within each embodiment should typically be considered as available for other similar features or aspects in other embodiments. While one or more embodiments have been described with reference to the figures, it will be understood by those of ordinary skill in the art that various changes and details may be made therein without departing from the spirit and scope as defined by the following claims.

What is claimed is:

1. A display device, comprising:
   a substrate;
   a plurality of first electrodes disposed on the substrate;
   a pixel defining layer disposed on the substrate, and defining a plurality of opening areas, each opening area extending to a portion of an upper surface of a respective first electrode of the plurality of first electrodes;
   a spacer disposed on the pixel defining layer, the spacer being disposed between two adjacent opening areas among the plurality of opening areas;
   a groove extending into the spacer on an electrode-free part of the substrate between adjacently positioned first electrodes of the plurality of first electrodes, the groove at least partially overlapping with an imaginary straight line connecting two points located at the shortest distance between the two adjacent opening areas in plan view;
   a first common layer covering the plurality of first electrodes, the pixel defining layer, and the spacer;
   a plurality of light emitting layers disposed on the first common layer above the plurality of opening areas; and
   a second electrode covering the first common layer in the groove on the electrode-free part of the substrate, and covering the plurality of light emitting layers.

2. The display device of claim 1, wherein the spacer surrounds the groove.

3. The display device of claim 2, wherein the groove has a rectangular shape in plan view.

4. The display device of claim 2, wherein the groove has a cross shape in plan view.

5. The display device of claim 1, wherein the first common layer covers a sidewall of the groove.

6. The display device of claim 5, wherein the first common layer covers an upper surface of the pixel defining layer at a base of the groove.

7. The display device of claim 1, wherein the groove extends into at least a portion of the pixel defining layer.

8. The display device of claim 1, further comprising:
   a second common layer disposed between the plurality of light emitting layers and the second electrode and covering the plurality of light emitting layers and the first common layer.

9. The display device of claim 8, wherein the second common layer extends into the groove.

10. The display device of claim 1, wherein each of the plurality of light emitting layers extends over the spacer.

11. The display device of claim 1, wherein each of the plurality of first electrodes is an anode electrode, the first common layer is a hole injection layer, and the second electrode is a cathode electrode.

* * * * *